(12) United States Patent
Takashima

(10) Patent No.: US 8,314,050 B2
(45) Date of Patent: Nov. 20, 2012

(54) MATERIAL FOR PRESSURE MEASUREMENT

(75) Inventor: Masanobu Takashima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 453 days.

(21) Appl. No.: 12/668,022

(22) PCT Filed: Jun. 27, 2008

(86) PCT No.: PCT/JP2008/061737
§ 371 (c)(1),
(2), (4) Date: Jan. 7, 2010

(87) PCT Pub. No.: WO2009/008269
PCT Pub. Date: Jan. 15, 2009

(65) Prior Publication Data
US 2010/0323188 A1    Dec. 23, 2010

(30) Foreign Application Priority Data
Jul. 9, 2007 (JP) ................................ 2007-179969

(51) Int. Cl.
*B41M 5/165* (2006.01)
(52) U.S. Cl. ........................................ 503/215; 503/225
(58) Field of Classification Search .................. None
See application file for complete search history.

(56) References Cited

U.S. PATENT DOCUMENTS
4,002,060 A * 1/1977 Ogata et al. .................... 73/762

FOREIGN PATENT DOCUMENTS
| JP | 57-24852 B2 | 5/1982 |
| JP | 7-96662 A | 4/1995 |
| JP | 2786510 B2 | 8/1998 |
| JP | 3019163 B2 | 3/2000 |
| JP | 3074891 B2 | 8/2000 |

* cited by examiner

Primary Examiner — Bruce H Hess
(74) Attorney, Agent, or Firm — SOLARIS Intellectual Property Group, PLLC

(57) ABSTRACT

A material for pressure measurement is provided, the material having a substrate made of plastic, a color forming agent layer containing a colorless electron-donating dye precursor and a color developing agent layer containing an electron-accepting compound, the material for pressure measurement forming a color utilizing a color forming reaction between the colorless electron-donating dye precursor and the electron-accepting compound, wherein the colorless electron-donating dye precursor is included in a microcapsule containing an urethane bond, wherein at least one kind of the electron-accepting compound is a metal salt of salicylic acid having a substituent, and wherein the microcapsule satisfies a relation $\delta/D =$ from $1.0 \times 10^{-3}$ to $2.0 \times 10^{-2}$, where $\delta$ is a number-average wall thickness (μm) of the microcapsules, and D is a median diameter (μm) of microcapsules on a volume basis.

18 Claims, No Drawings

MATERIAL FOR PRESSURE MEASUREMENT

TECHNICAL FIELD

The present invention relates to a material for pressure measurement with which the distribution of pressure such as surface pressure is measured.

BACKGROUND ART

A material for measuring pressure is used in applications to a step of laminating liquid crystal glass, solder printing onto a print substrate, and regulation of pressure between rollers.

As the material for measuring pressure, for example, there is a pressure measuring film represented by Prescale (trade name) provided by Fujifilm Corporation. The pressure measuring film has such characteristic that the film can be used after being cut into an arbitrary size in accordance with a measuring site. Further, the pressure measuring film has such characteristic as capable of measuring surface pressure, differing from a so-called pressure-sensitive copying paper in which a color forming reaction occurs by high line pressure caused by writing pressure.

As an example of the pressure measuring film, a pressure measuring sheet utilizing a color forming reaction between an colorless electron-donating dye precursor and an electron-accepting compound is disclosed (see, for example, Japanese Patent Application Publication (JP-B) No. 57-24852), which is announced to be usable in the measurement of pressure ranging around from 0.1 Mpa to 20 Mpa. For the substrate of the pressure measuring film, generally, a film made of plastic such as polyethylene terephthalate is used.

Recently, as the result of high functionality and high fineness of products, the necessity of measuring the distribution of minute pressures is increasing. For example, for bonding panels using a pressurizing system such as a liquid crystal display and a plasma display, it is frequently carried out within a pressure region of 3 MPa or less for a large area, and the measurement of pressure distribution of 3 MPa or less has become important.

On the other hand, there is disclosed a pressure-sensitive copying sheet that uses substituted metal salt of salicylic acid as a color developing agent and encapsulates dye in a capsule having a polyurea resin/polyurethane resin wall membrane (see, for example, Japanese Patent Application Laid-Open (JP-A) No. 7-96662). Further, a pressure-sensitive recording paper using an amide-based compound is conventionally known (see, for example, JP-A No. 2786510, JP-A No. 3019163, and JP-A No. 3074891), and there are proposed ones using acrylamide copolymer, sulfonamide or a (meth) acrylic acid ester compound as the amide-based compound.

DISCLOSURE OF THE INVENTION

Problem to be Solved by the Invention

However, the aforementioned conventional pressure-sensitive copying sheet can form color only when the impact strength of an electric typewriter to be used is set to high-pressure, with that the diameter and wall thickness of the capsule, and is not suitable for applications of measuring pressure of a certain area (surface pressure). Further, the aforementioned pressure-sensitive recording paper using an amide-based compound locally expresses strong coloring (color forming reaction) by high line pressure by writing pressure. Accordingly, in fields in which it is necessary to grasp a pressure state by giving such minute local pressure or weak surface pressure as, for example, less than 3 MPa, coloring (color formation) of a level that enables the pressure state to be measured can not be obtained.

Consequently, in fields as described above in which slight pressure change affects the variation of product quality, there are such problems that faint pressure change can not be grasped, or, even when coloring is obtained, it can not be read by scanning, or the reading accuracy upon reading it as density data is degraded to disable fine density analysis or control to be carried out.

The invention was achieved with the view of the above situation. Under the above situation, a material for pressure measurement, which enable color to be formed satisfactorily in a low pressure (particularly, a pressure of 3 MPa or less) region and enable the density to be read satisfactorily, is needed. Further, a material for pressure measurement, which may give a broad color forming area when color is formed at a low pressure (particularly, a pressure of 3 MPa or less) region to improve the accuracy of repeated reading upon the reading of color forming density by scanning or the like, is needed.

Means for Solving the Problem

As the result of hard study for solving the problem, the invention is based on such knowledge that, in a color forming recording system utilizing a color forming reaction between an colorless electron-donating dye precursor and an electron-accepting compound provided on a substrate made of plastic, the use of a specified metal salt of salicylic acid as a color developing agent and the adjustment of the ratio between the film thickness and particle diameter of an urethane bond-including microcapsule encapsulating a color forming agent in a specified range are effective for raising the coloring degree when forming color by giving pressure in a low pressure region. Further, the invention is based on such knowledge that the use of an amide compound or a (meth)acrylic acid ester compound with a color developing agent increases the area of a color forming portion and is effective for improving the accuracy of reading density upon carrying out density scanning or the like.

Specific means for achieving the above purpose are as follows.

<1> A material for pressure measurement comprising a substrate made of plastic, a color forming agent layer containing an colorless electron-donating dye precursor and a color developing agent layer containing an electron-accepting compound, the material for pressure measurement forming a color utilizing a color forming reaction between the colorless electron-donating dye precursor and the electron-accepting compound, wherein the colorless electron-donating dye precursor is included in a microcapsule containing an urethane bond, wherein at least one kind of the electron-accepting compounds is a metal salt of salicylic acid having a substituent, and wherein the microcapsule satisfies a relation $\delta/D =$ from $1.0 \times 10^{-3}$ to $2.0 \times 10^{-2}$, where $\delta$ is a number-average wall thickness (μm) of the microcapsules, and D is a median diameter (μm) of the microcapsules on a volume basis.

<2> The material for pressure measurement as described in the <1>, wherein the material for pressure measurement forms a color at a pressure of 3 MPa or less.

<3> The material for pressure measurement as described in the <1> or <2>, wherein the median diameter of the microcapsules on a volume basis is 10 μm or more.

<4> The material for pressure measurement as described in any one of the <1> to <3>, wherein the color developing agent layer further contains at least one kind selected from amide compounds and (meth)acrylic acid ester compounds.

<5> The material for pressure measurement as described in the <4>, wherein the amide compound is a (meth)acrylamide-based polymer or a sulfonamide compound, and the (meth)acrylic acid ester compound is a (meth)acrylic acid ester-based polymer.

<6> The material for pressure measurement as described in any one of the <1> to <5>, wherein the color developing agent layer is formed by coating an aqueous dispersion liquid containing a metal salt of salicylic acid having a substituent and at least one kind selected from amide compounds and (meth) acrylic acid ester compounds on the substrate.

<7> The material for pressure measurement as described in any one of the <1> to <6>, wherein the color developing agent layer containing the electron-accepting compound and the color forming agent layer containing the microcapsule including the colorless electron-donating dye precursor are disposed in this order on a substrate.

<8> The material for pressure measurement as described in any one of the <1> to <6> including a material A having the color developing agent layer containing an electron-accepting compound on a substrate, and a material B having the color forming agent layer containing a microcapsules including an colorless electron-donating dye precursor on a substrate.

<9> The material for pressure measurement as described in any one of the <1> to <8>, wherein a molar absorbance coefficient ($\epsilon$) of the colorless electron-donating dye precursor is 10,000 $mol^{-1} \cdot cm^{-1} \cdot L$ or more.

<10> The material for pressure measurement as described in the <9>, wherein a ratio of the colorless electron-donating dye precursor having a molar absorbance coefficient ($\epsilon$) of 10,000 $mol^{-1} \cdot cm^{-1} \cdot L$ or more, with respect to a total amount of the colorless electron-donating dye precursor, is from 30 to 100% by mass.

<11> The material for pressure measurement as described in any one of the <1> to <10>, wherein a capsule wall thickness of the microcapsules is in the range of 0.005 to 2.0 µm.

<12> The material for pressure measurement as described in any one of the <1> to <11>, wherein the median diameter of the microcapsules on a volume basis is from 10 to 40 µm, and the capsule wall thickness of the microcapsules is from 0.01 to 1 µm.

<13> The material for pressure measurement as described in any one of the <1> to <12>, wherein the substituent of a metal salt of salicylic acid is an alkyl group having 1 to 15 carbon atoms or an aralkyl group having 7 to 18 carbon atoms.

<14> The material for pressure measurement as described in any one of the <1> to <13>, wherein the metal salt of salicylic acid is a zinc salt, a nickel salt, an aluminum salt or a calcium salt of salicylic acid.

<15> The material for pressure measurement as described in any one of the <1> to <14>, wherein the capsule wall of the microcapsule is made of polyurethane-urea.

<16> The material for pressure measurement as described in any one of the <1> to <15>, wherein the $\delta/D$ is from $2.0 \times 10^{-3}$ to $1.5 \times 10^{-2}$.

<17> The material for pressure measurement as described in any one of the <1> to <16>, wherein the amount of the metal salt of salicylic acid in the color developing agent layer is from 0.1 to 30 $g/m^2$.

<18> The material for pressure measurement as described in any one of the <4> to <17>, wherein a total content of the amide compound and the (meth)acrylic acid ester compound in the color developing agent layer is from 0.2 to 20 parts by mass relative to 100 parts by mass of the electron-accepting compound.

EFFECT OF THE INVENTION

According to the invention, it is possible to provide a material for pressure measurement that enables color to be favorably formed in a low pressure (particularly a pressure of 3 MPa or less) region and enables density to be favorably read.

In addition, according to the invention, it is possible to provide a material for pressure measurement that may give a broad color forming area when color is formed in a low pressure (particularly, a pressure of 3 MPa or less) region and enhance the accuracy in repeated reading upon reading the color forming density by scanning or the like.

BEST MODE FOR CARRYING OUT THE INVENTION

Hereinafter, the material for pressure measurement of the present invention will be explained in detail.

The material for pressure measurement of the invention is constituted by preparing a substrate made of plastic, a color forming agent layer containing an colorless electron-donating dye precursor, and a color developing agent layer containing an electron-accepting compound, wherein the colorless electron-donating dye precursor is included in a microcapsule containing an urethane bond, at least one kind of the electron-accepting compound is a metal salt of salicylic acid having a substituent, and the microcapsule including the colorless electron-donating dye precursor satisfies the relation $\delta/D$=from $1.0 \times 10^{-3}$ to $2.0 \times 10^{-2}$ [$\delta$: number-average wall thickness of the microcapsule (µm), D: median diameter (µm) of the microcapsule on a volume basis].

The material for pressure measurement of the invention may give coloring by a color forming reaction between the colorless electron-donating dye precursor contained in the color forming agent layer and the electron-accepting compound contained in the color developing agent layer when pressure is applied.

Here, the constitution of the material for pressure measurement will be explained.

The material for pressure measurement of the invention may be constituted by providing (preferably by coating) a color forming agent layer having microcapsules, which contain an urethane bond in the capsule wall, encapsulating an colorless electron-donating dye precursor (preferably with a solvent), and a color developing agent layer having an electron-accepting compound (hereinafter, also called a "color developing agent") that develops color by reacting with the colorless electron-donating dye precursor on a single substrate or separated substrates made of plastic.

When the material for pressure measurement of the invention is a so-called mono-sheet type, in which the microcapsule and the electron-accepting compound are provided on a single substrate by coating or the like, the material for pressure measurement is composed of a substrate such as sheet, film or the like, a color developing agent layer containing a color developing agent, and a color forming agent layer containing a microcapsule provided on the substrate in order from the side of the substrate. The material for pressure measurement is singly held on a portion for which pressure or pressure distribution is to be measured, and pressure is applied.

On the other hand, when the material for pressure measurement of the invention is a so-called 2-sheet type, in which the microcapsule and the electron-accepting compound are provided on separated substrates by coating or the like, the material for pressure measurement is constituted by providing a material A having a color developing agent layer containing a color developing agent on a substrate such as sheet, film or the like, and a material B having a color forming agent layer containing a microcapsule on a substrate such as sheet, film or the like. In the case of the material for pressure measurement, both materials are layered so that the surface of the material B existing the microcapsule (the surface of the color forming agent layer), and the surface of the material A existing the electron-accepting compound (the surface of the color developing agent layer), are disposed in contact with each other, and, in the layered state, they are held on a portion for which pressure or pressure distribution is to be measured, and pressure is applied.

The pressurization can be carried out by giving pressure in a point, linear or area (such as point pressure, linear pressure, surface pressure, or the like) in an arbitrary method. The invention is effective, particularly at a low pressure range of 3 MPa or less, in case a density difference in a coloring part for differentiating a minute pressure difference is small and a surface pressure that differential pressure is hardly grasped is given.

By applying pressure as described above, the microcapsule is broken to release encapsulated materials including the colorless electron-donating dye precursor, and the colorless electron-donating dye precursor and the electron-accepting compound react to actualize coloring. On this occasion, according to increasing the applied pressure, the encapsulated material including the colorless electron-donating dye precursor is released in more amount to increase the reaction amount with the electron-accepting compound, and deeper color forming (coloring) is obtained along with the reaction amount.

In the invention, a color forming reaction system of the colorless electron-donating dye precursor and the electron-accepting compound being provided on substrate made of plastic can give favorable color formation (coloring) when being pressurized in a low pressure region (preferably in a pressure region of 3 MPa or less), by employing a specified metal salt of salicylic acid as a color developing agent and adjusting the ratio between the film thickness and the particle diameter of a microcapsules, which contain an urethane bond, including a color forming agent within a specified range shown below. Further, when an amide compound and/or a (meth)acrylic acid ester compound, which is described later, is used in combination, a broad color forming (coloring) area is obtained, to enable repeated reading accuracy to be more enhanced upon reading the color forming density by scanning or the like. A more preferable pressure region, in which the material for pressure measurement of the invention is applied, is 2 MPa or less, and further 1 MPa or less.

Of the above, the material for pressure measurement of the invention is more preferably constituted in a 2-sheet type, in which the microcapsule including the colorless electron-donating dye precursor, and the electron-accepting compound are provided on separated substrates by coating or the like, from the point of the storability and handling characteristics.

(Substrate)

The material for pressure measurement of the invention is constituted using a substrate made of plastic. The substrate made of plastic may have any of a sheet-like shape, a film-like shape, a plate-like shape and the like. The material for pressure measurement may be a shape of either of a mono-sheet type and a 2-sheet type.

Examples of substrates made of plastic include film or sheet of a polyester such as a polyethylene terephthalate, cellulose derivatives such as a triacetylcellulose, polyolefin such as a polypropylene, a polyethylene, and polystyrene, and the like, ones produced by subjecting polypropylene, polyethylene terephthalate and the like to biaxial stretching to form many microvoids (YUPO and the like), ones made of a synthetic fiber of a polyethylene, a polypropylene, a polyethylene terephthalate, a polyamide and the like, and ones produced by laminating these on a part of, on one side of, or on both sides of paper. Specific examples of paper include a high-quality paper, a medium-grade paper, a woody paper, an acid-free paper, an acid paper, a recycled paper, a coated paper, a machine coated paper, an art paper, a cast-coated paper, a slightly coated paper, a tracing paper, a recycled paper and the like.

But, in the invention, they are not limited to these.

The color forming agent layer that constitutes the material for pressure measurement of the invention contains at least a microcapsule including the colorless electron-donating dye precursor, preferably with a solvent, and further, may be constituted by using another component according to need.

(Microcapsule)

The color forming agent layer in the invention contains a microcapsule including an urethane bond, and an colorless electron-donating dye precursor (and preferably a solvent) is included in the microcapsule. In the invention, since the capsule including an urethane bond is selected as the microcapsule for encapsulating an colorless electron-donating dye precursor being a color forming agent, a color forming system that easily forms color even by the pressurization in a low pressure region (preferably a pressure region of 3 MPa or less) may be formed.

The microcapsule including an urethane bond is formed using urethane-urea resin (polyurethane-urea) as a wall material, the microcapsule gives favorable color forming in a low pressure region (preferably a pressure region of 3 MPa or less).

The microcapsule including an colorless electron-donating dye precursor satisfies the relation shown by Formula 1 below. By constituting the microcapsule so as to satisfy the formula, it is possible to form a color forming system that easily forms color even by the pressurization in a low pressure region (preferably a pressure region of 3 MPa or less). In Formula 1 below, $\delta$ represents number-average wall thickness ($\mu$m) of the microcapsule, and D represents the median diameter ($\mu$m) of microcapsule on a volume basis.

$$1.0 \times 10^{-3} \leq \delta/D \leq 2.0 \times 10^{-2} \quad \text{Formula 1}$$

Here, the wall thickness means the thickness of a resin film forming a capsule particle of the microcapsule (so-called a capsule wall), and the number-average wall thickness ($\mu$m) refers to an average value of capsule walls of 5 microcapsules averaged under a scanning electron microscope.

The median diameter on a volume basis in the invention is a diameter $D^{50}$ wherein, when all of the microcapsules are divided into two groups with a particle diameter at which an accumulated amount of particle volume is 50% as a threshold, the total volume of particles on the larger-diameter side and the total volume of particles on the smaller-diameter side are an equal amount. The median diameter on a volume basis is a value calculated by applying a microcapsule liquid onto a support, photographing its surface at a magnitude of 150 with a light microscope, and measuring the size of every microcapsule in an area of 2 cm×2 cm.

When the $\delta/D$ value is less than $1.0\times10^{-3}$, the capsule size is large but capsule wall is too thin, and leakage of the capsule content occurs with time. Inversely, when the $\delta/D$ value is more than $2.0\times10^{-2}$, the capsule size is small or the capsule wall is too thick, and favorable color formation can not be obtained in a low pressure region (preferably in a low pressure region of 3 MPa or less).

In the range of the $\delta/D$ value, from the point of obtaining favorable color formation (coloring) in a low pressure region (preferably a pressure region of 3 MPa or less), the $\delta/D$ value is preferably from $2.0\times10^{-3}$ to $1.5\times10^{-2}$, more preferably from $3.0\times10^{-3}$ to $1.3\times10^{-2}$.

The microcapsule including colorless electron-donating dye precursor (and preferably a solvent) may be produced by such conventionally publicly known method such as an interfacial polymerization method, an internal polymerization method, a phase separation method, an external polymerization method or a coacervation method.

For preparing a dispersion liquid of a microcapsule having a polyurethane-urea wall that encapsulates the colorless electron-donating dye precursor, a publicly known method in the pressure-sensitive copying paper application may be used. For example, there is such method in which a solution prepared by dissolving an colorless electron-donating dye precursor and a polyvalent isocyanate in a solvent (an oil phase) is emulsified and dispersed in a hydrophilic solution (for example, water; a water phase) containing a water-soluble polymer (a capsule wall-forming material such as polyol or polyamine), and covering oil drops in the obtained dispersion liquid with polyurethane-urea to form microcapsules. At this time, a polymer-forming reaction proceeds at the interface of the oil drop by heating to enable the microcapsule wall to be formed.

In the middle of the process of forming a microcapsule, reaction adjustment agents such as a polyvalent hydroxyl compound and a polyvalent amine may be added. Specific examples of polyvalent hydroxyl compounds include an aliphatic or aromatic polyhydric alcohol, a hydroxypolyester, a hydroxypolyalkylene ether, an alkylene oxide adduct of polyvalent amine and the like. Among these, the aliphatic or aromatic polyhydric alcohol and an alkylene oxide adduct of polyvalent amine are preferable, and the alkylene oxide adduct of polyvalent amine is more preferable.

As the polyvalent amine, any that has two or more —NH groups or —NH$_2$ groups in a molecule may be used. Examples of specific compounds include aliphatic polyvalent amines such as a diethylenetriamine, a triethylenetetramine, a 1,3-propylenediamine or a hexamethylenediamine; epoxy compound adducts of an aliphatic polyvalent amine; alicyclic polyvalent amines such as a piperazine; and heterocyclic diamines such as 3,9-bis-aminopropyl-2,4,8,10-tetraoxaspiro-(5,5)undecane.

The addition amount of the polyvalent hydroxyl compound or polyvalent amine is appropriately determined according to the kind and amount of polyvalent isocyanate to be used, and, further, according to an intended hardness of capsule membrane, or the like. When adding the polyvalent hydroxyl compound or polyvalent amine, the ratio (mass ratio) "the total amount of polyvalent hydroxyl compound and/or polyvalent amine: amount of polyvalent isocyanate" is preferably 0.1:99.9 to 30:70, more preferably 1:99 to 25:75. Regarding the addition amount of the polyvalent hydroxyl compound, polyvalent isocyanate:polyvalent hydroxyl compound is preferably 99.9:0.1 to 70:30 in mass ratio, more preferably 99:1 to 75:25, furthermore preferably 98:2 to 80:20.

Regarding the addition timing of the polyvalent hydroxyl compound or the polyvalent amine, it may previously be added in a solvent or an auxiliary solvent for dissolving the colorless electron-donating dye precursor, or may be added prior to or after the emulsifying dispersion.

In the hydrophilic solution, various amphoteric polymers, ionic polymers or nonionic polymers, for example, gelatin, starch, carboxymethylcellulose, polyvinyl alcohol, polyalkylbenzene sulfonate, polyoxyethylene sulfate, polyoxyalkyl ether or a modified products thereof, isobutylene-maleic anhydride copolymer or the like, may be added as an emulsifying agent.

As the polyvalent isocyanate, one publicly known in the pressure-sensitive copying paper application may be used. Examples thereof include an isocyanulate form of hydrogenated xylylene diisocyanate (generally called hydrogenated XDI), an isocyanulate form of isoholon diisocyanate (generally called IPDI), a 4,4'-diphenylmethane diisocyanate, an adduct of a hexamethylene diisocyanate and a trimethylolpropane, a biuret form of a hexamethylene diisocyanate, an isocyanulate form of a hexamethylene diisocyanate, compounds formed by bonding an aliphatic diol (such as alkylene diol) to an isocyanulate form of a hexamethylene diisocyanate by an urethane bond, a polymethylenepolyphenyl isocyanate, a carbodiimide-modified diphenylmethane diisocyanate, an adduct of tolylene diisocyanate and trimethylolpropane, an adduct of xylylene diisocyanate and trimethylolpropane, an isocyanulate form of tolylene diisocyanate, an addition body of hydrogenated xylylene diisocyanate and trimethylolpropane, an addition body of isoholon diisocyanate and trimethylolpropane, a biuret form of xylylene diisocyanate, and tris-(p-isocyanatephenyl)thiophosphite. The polyvalent isocyanate may be used in one kind alone, or in two or more kinds in mixture.

Further, the microcapsule may encapsulate an additive, according to need, in addition to the colorless electron-donating dye precursor, solvent and auxiliary solvent. Examples of additives include an ultraviolet absorber, a light stabilizer, an antioxidant, wax, an odor suppressant, and the like.

The mass ratio of the solvent and the colorless electron-donating dye precursor (solvent:precursor) included in the microcapsule is preferably in the range of 98:2 to 30:70 from the point of color forming properties, more preferably in the range of 97:3 to 40:60, furthermore preferably in the range of 95:5 to 50:50.

The median diameter of microcapsule on a volume basis is preferably 10 µm or more from the point of raising color forming density at a low pressure (preferably a pressure of 3 MPa or less (preferably surface pressure)) and improving viewability and reading properties upon scanning, more preferably 10 to 40 µm, furthermore preferably 13 to 30 µm, particularly preferably 16 to 25 µm.

Regarding the capsule wall thickness of the microcapsule, it depends on various conditions such as the kind of a capsule wall material or the capsule diameter, but it can be arbitrarily selected without limitation, as long as it is in the range that enables the capsule wall to be broken by the pressurization at a low pressure (preferably 3 MPa or less). Meanwhile, from the point of obtaining favorable color forming properties at a low pressure of 3 MPa or less, a favorable wall thickness falls in the range of 0.005 to 2.0 µm, and, more preferably, 0.01 to 1 µm when the median diameter A of the microcapsule is set to 10 to 40 µm.

(Colorless Electron-Donating Dye Precursor)

The microcapsule contained in the color forming agent layer of the material for pressure measurement of the invention encapsulates at least one kind of colorless electron-donating dye precursors.

As the colorless electron-donating dye precursor included in the microcapsule, one publicly known in the application of a pressure-sensitive copying paper or a heat-sensitive recording paper may be used. For example, various kinds of compounds such as triphenylmethane phthalide-based compounds, fluoran-based compounds, phenothiazine-based compounds, indolyl phthalide-based compounds, leucoauramine-based compounds, rhodaminelactam-based compounds, triphenylmethane-based compounds, diphenylmethane-based compounds, triazene-based compounds, spiropyran-based compounds or fluorene-based compounds may be used.

Details of these compounds are described in JP-A Nos. 1-20189, 5-257272, 2004-195869, 2007-1064 or the like. The colorless electron-donating dye precursor may be used in one kind alone or in two or more kinds in mixture.

For the colorless electron-donating dye precursor, one that has a high molar absorbance coefficient ($\epsilon$) is preferable, from the point of enhancing color forming properties at a low pressure (preferably a pressure of 3 MPa or less (preferably surface pressure)) to give high density at a low pressure (enhancing density change relative to pressure change (density gradient)). The molar absorbance coefficient ($\epsilon$) of the colorless electron-donating dye precursor is preferably 10,000 $mol^{-1} \cdot cm^{-1} \cdot L$ or more, more preferably 15000 $mol^{-1} \cdot cm^{-1} \cdot L$ or more, furthermore preferably 25000 $mol^{-1} \cdot cm^{-1} \cdot L$ or more.

Preferable examples of colorless electron-donating dye precursors having $\epsilon$ in this range include triphenylmethane phthalide-based compounds, fluoran-based compounds, indolyl phthalide-based compounds, leucoauramine-based compounds, rhodaminelactam-based compounds, triphenylmethane-based compounds and the like.

When using one kind alone of an colorless electron-donating dye precursor having a molar absorbance coefficient $\epsilon$ in the above range, or two or more kinds in mixture including an colorless electron-donating dye precursor having a molar absorbance coefficient $\epsilon$ in the above range, the ratio of the colorless electron-donating dye precursor having a molar absorbance coefficient ($\epsilon$) of 10,000 $mol^{-1} \cdot cm^{-1} \cdot L$ or more, with respect to the total amount of the colorless electron-donating dye precursor, is from 10 to 100% by mass, more preferably in the range of 20 to 100% by mass, and further preferably in the range of 30 to 100% by mass, from the point of enhancing color forming properties at a low pressure (preferably a pressure of 3 MPa or less (preferably surface pressure)) to give high density at a low pressure (enhancing density change relative to pressure change (density gradient)).

When using two or more kinds of colorless electron-donating dye precursors, the use of ones each having $\epsilon$ of 10,000 $mol^{-1} \cdot cm^{-1} \cdot L$ or more in combination is preferable.

The molar absorbance coefficient ($\epsilon$) may be calculated from the absorbance when the colorless electron-donating dye precursor is dissolved in a 95% acetic acid aqueous solution. Specifically, for a 95% acetic acid aqueous solution of the colorless electron-donating dye precursor in which the concentration is controlled so as to give an absorbance of 1.0 or less, when the length of a measurement cell is A cm, the density of the colorless electron-donating dye is B mol/L, and the absorbance is C, it may be calculated from the following formula.

Molar absorbance coefficient($\epsilon$)=$C/(A \times B)$

The amount (for example, a coating amount) of the colorless electron-donating dye precursor is preferably 0.1 to 5 $g/m^2$ by mass after drying, more preferably 0.1 to 4 $g/m^2$, further preferably 0.2 to 3 $g/m^2$, from the point of enhancing color forming properties at a low pressure (preferably 3 MPa or less).

(Solvent)

The microcapsule in the invention preferably includes at least one kind of solvent with the colorless electron-donating dye precursor.

As the solvent to be included in the microcapsule, one publicly known in the pressure-sensitive copying paper application may be used. Examples of solvents include aromatic hydrocarbons such as alkylnaphthalenes such as a diisopropylnaphthalene, diarylalkanes such as a 1-phenyl-1-xylylethane, alkylbiphenyls such as an isopropylbiphenyl, and, in addition, triarylmethanes, alkylbenzenes, benzylnaphthalenes, diarylalkylenes or arylindans; aliphatic hydrocarbons such as a dibutyl phthalate or an isoparaffin; natural plant and animal oils such as a soybean oil, a corn oil, a cotton seed oil, a rape seed oil, an olive oil, a palm oil, a ricinus oil or a fish oil; high boiling point fractions of natural products such as mineral oil, and the like. The solvent may be used in one kind alone or in two or more kinds in mixture.

Further, according to need, a solvent having a boiling point of 130° C. or less such as ketones such as a methyl ethyl ketone, esters such as an ethyl acetate, or alcohols such as an isopropyl alcohol may also be added as an auxiliary solvent.

(Preparation of Preparing Liquid for Forming Color Forming Agent Layer)

Microcapsules may be obtained as a dispersion liquid as described above, and the dispersion liquid of the microcapsule may directly be employed as a preparing liquid (particularly a coating liquid) for forming the color forming agent layer containing the colorless electron-donating dye precursor. In addition, to the dispersion liquid obtained as described above, a fine powder of starch or a starch derivative, a buffering agent such as a powder of cellulose fiber, a water-soluble polymer bonding agent such as a polyvinyl alcohol, a hydrophobic polymer bonding agent such as a vinyl acetate-based, acrylic-based or styrene-butadiene copolymer latex, a fluorescent whitening agent, an antifoaming agent, a penetrating agent, an ultraviolet absorbing agent or an antiseptic agent is further added to give a preparing liquid (particularly a coating liquid).

The color forming agent layer constituting the material for pressure measurement may be formed by giving the preparing liquid (particularly a coating liquid) obtained in this way onto a substrate and being dried.

When the preparing liquid for forming the color forming agent layer is used as a coating liquid, the coating method of the coating liquid may be practiced by carrying out coating and drying using an ordinary coating machine. Specific examples of coating machines include an air knife coater, a rod coater, a bar coater, a curtain coater, a gravure coater, an extrusion coater, a die coater, a slide bead coater, a blade coater, and the like.

When the material for pressure measurement of the invention is a 2-sheet type constituted by the coating or the like of the microcapsule including the colorless electron-donating dye precursor, and the electron-accepting compound on separated substrates, respectively, for example, by coating and drying the coating liquid on an intended sheet-like substrate directly or via another layer, a sheet material in which at least the color forming agent layer is formed may be obtained. In the case of the mono-sheet type constituted by the coating or the like of the microcapsule including the colorless electron-donating dye precursor, and the electron-accepting compound on a single sheet-like substrate, for example, the material for pressure measurement is obtained by coating and drying the coating liquid over a color developing agent layer, which will be described later, formed on an intended substrate.

The color developing agent layer constituting the material for pressure measurement of the invention may be constituted by including at least the electron-accepting compound (the color developing agent), preferably by including an amide compound and/or a (meth)acrylic acid ester compound, and, according to need, by using another component.

(Electron-Accepting Compound)

The color developing agent layer in the invention contains at least one kind of a metal salt of salicylic acid having a substituent as the electron-accepting compound (the color developing agent). The use of the metal salt of salicylic acid having a substituent enables both a higher color forming density and the improvement of the reading accuracy at a low pressure region to be satisfied.

Examples of the substituent of the metal salt of salicylic acid having a substituent include an alkyl group having 1 to 15 carbon atoms (examples: a methyl group, an ethyl group, an (iso)propyl group, a (tertiary)butyl group, a (tertiary)amyl group, a (tertiary)octyl group, an (iso)nonyl group, an (iso) dodecyl group, an (iso)pentadecyl group, and the like), a cycloalkyl group having 5 to 12 carbon atoms (examples: a cyclopentyl group, a cyclohexyl group, and the like), an aralkyl group having 7 to 18 carbon atoms (examples: a benzyl group, an α-methylbenzyl group, an α,α-dimethylbenzyl group, and the like), an aryl group having 6 to 18 carbon atoms (examples: a phenyl group, a naphthyl group, a tertiary-octylphenyl group, and the like), an alkoxy group having 1 to 15 carbon atoms (examples: a methoxy group, an ethoxy group, an octyloxy group, a dodecyloxy group, and the like), and the like. From the point of color forming properties, the alkyl group and the aralkyl group are preferable.

As the metal salt of salicylic acid, there are zinc salt, nickel salt, aluminum salt, calcium salt and the like of salicylic acid, and, from the point of dispersion stability, the zinc salt is preferable.

Preferable specific examples of metal salts of salicylic acid having a substituent include zinc salt, nickel salt, aluminum salt, calcium salt or the like, such as 3,5-di-t-butylsalicylic acid, 3,5-di-t-octylsalicylic acid, 3,5-di-iso-nonylsalicylic acid, 3,5-di-iso-dodecylsalicylic acid, 3-isononyl-5-methoxysalicylic acid, 3-iso-dodecylsalicylic acid, 5-iso-dodecylsalicylic acid, 5-cyclohexylsalicylic acid, 3,5-bis(α,α-dimethylbenzyl)salicylic acid, 3,5-bis(α-methylbenzyl)salicylic acid, 3-methyl-5-(α-methylbenzyl)salicylic acid, 3-(α,α-dimethylbenzyl)-5-methylsalicylic acid, 3-(α,α-dimethylbenzyl)-6-methylsalicylic acid, 3-(α-methylbenzyl)-5-(α,α-dimethylbenzyl)salicylic acid, 3-(α,α-dimethylbenzyl)-6-ethylsalicylic acid, 3-phenyl-5-(α,α-dimethylbenzyl) salicylic acid, carboxyl-modified terpenephenol resin, salicylic acid resin being a reaction product of 3,5-bis(α-methylbenzyl)salicylic acid and benzyl chloride, and the like.

In the color developing agent layer of the invention, another color developing agent (the electron-accepting compound) may be used in combination with the metal salt of salicylic acid having a substituent. As a color developing agent usable in combination, either of an inorganic compound and an organic compound may be mentioned. Specific examples of the inorganic compound include clay materials such as an acid clay, an activated clay, an attapulgite, a zeolite, a bentonite or a kaolin, and the like. As the organic compound, metal salt of phenol-formaldehyde resin, carboxylated terpelphenol resin, and the like are mentioned. Among these, acid clay, active clay, and kaolin are more preferable.

The amount (in the case of coating, a coating amount) of the metal salt of salicylic acid having a substituent in the color developing agent layer is preferably 0.1 to 30 $g/m^2$ by mass after drying, more preferably 0.5 to 15 $g/m^2$. Regarding the amount of the metal salt of salicylic acid, 0.1 $g/m^2$ or more gives high color forming density at a low pressure, and 30 $g/m^2$ or less gives a material for pressure measurement (for example, a color developing agent sheet) that does not generate powder falling when being formed into a roll-like shape.

When using another color developing agent in combination with the metal salt of salicylic acid having a substituent, the amount of the other color developing agent may be selected within a range that does not ruin the effect of the invention, but is preferably 1 to 50% by mass relative to the total amount of the color developing agent including the metal salt of salicylic acid having a substituent, from the point of enhancing the color forming density at a low pressure.

(Amide Compound/(Meth)Acrylic Acid Ester Compound)

The color developing agent layer in the invention preferably contains at least one kind selected from amide compounds and (meth)acrylic acid ester compounds. When constituting it as the color forming system that forms color (coloring) at a low pressure (particularly at a pressure of 3 MPa or less) as described above, the use of the amide compound and/or (meth)acrylic acid ester compound enables a color forming portion to bleed moderately to give a broad color forming area even in the pressurization of a low pressure (preferably a pressure of 3 MPa or less). This may enhance the repeated reading accuracy upon reading the color forming portion by, for example, scanning.

Examples of the amide compound include a (meth)acrylamide-based polymer such as a poly(meth)acrylamide, a copolymer of (meth)acrylamide and (meth)acrylic acid ester (example: copolymer of 96 to 70% by mole of acrylamide and 4 to 30% by mole of ester of (meth)acrylic acid, itaconic acid or maleic acid, with alkyl or alkoxyalkyl having 4 carbon atoms or less, and the like); sulfonamide compounds having at least a group selected from an alkyl group and an aryl group (example: toluene sulfonamide, N,N-dibutyltoluene sulfonamide, N,N-dibutylbenzene sulfonamide, N,N-dioctylmethane sulfonamide, N-butylbenzene sulfonamide, N-(toluenesulfonyl) morpholine, and the like), and the like. From the point of obtaining a broad color forming area even by the pressurization of a low pressure (particularly a pressure of 3 MPa or less) and enhancing the repeated reading accuracy upon reading the density of color forming by, for example, scanning or the like, the (meth)acrylamide-based polymer is more preferable.

Examples of (meth)acrylic acid ester compounds include (meth)acrylic acid ester-based polymer including (meth) acrylic acid ester having an alkyl group having 5 to 10 carbon atoms in the ester portion (examples: (meth)acrylic acid ester copolymer containing 5 to 95% by mass of (meth)acrylic acid ester having an alkyl group having 5 to 10 carbon atoms in the ester portion, and the like), (meth)acrylic-based emulsion, and the like.

Among the above, from the point of giving a broad color forming (coloring) area at the color forming with a low pressure (particularly a pressure of 3 MPa or less) and enhancing the repeated reading accuracy upon reading the color forming density by, for example, performing scanning, a (meth)acrylamide-based polymer and a (meth)acrylic acid ester-based polymer are preferable, and (meth)acrylamide-based polymer is more preferable.

The total content of the amide compound and the (meth) acrylic acid ester compound in the color developing agent layer is preferably 0.2 to 20 parts by mass, more preferably 0.3 to 10 parts by mass relative to 100 parts by mass of the color developing agent, from the point of giving a broad color forming area at the color forming with a low pressure (particularly a pressure of 3 MPa or less) and enhancing the repeated reading accuracy upon reading the color forming density by, for example, performing scanning.

(Preparation of Color Developing Agent Dispersion Liquid)

When the electron-accepting compound is the inorganic compound described above, the color developing agent dispersion liquid can be prepared by dispersion treating mechanically the inorganic compound with an aqueous system. When the electron-accepting compound is the organic compound, the liquid can be prepared by dispersion treating mechanically the organic compound with an aqueous system or dissolving it in an organic solvent.

About the detail thereof, the method described in JP-A No. 8-207435 can be referred to.

(Preparation of Preparing Liquid for Forming Color Developing Agent Layer)

The electron-accepting compound dispersion liquid prepared as described above may directly be used as a preparing liquid (particularly a coating liquid) for forming the color developing agent layer containing the electron-accepting compound. Further, to the preparing liquid (particularly the coating liquid) for forming the color developing agent layer, as a binder, a synthetic or natural high-molecular weight material such as a styrene-butadiene copolymer latex, a vinyl acetate-based latex, an acrylic acid ester-based latex, a polyvinyl alcohol, a polyacrylic acid, a maleic anhydride-styrene-copolymer, a starch, a casein, a gum arabic, a gelatin, a carboxymethylcellulose, a methylcellulose or the like may be added. In addition, to the preparing liquid (particularly the coating liquid), a kaolin, a calcined kaolin, a kaolin aggregate, a heavy calcium carbonate, a light calcium carbonate of various forms (such as rice grain-like, horn-like, spindle-like, bur-like, sphere-like, aragonite-based column-like, or amorphous), a talc, a rutile type or anatase type titanium dioxide, or the like may be added, as pigment. Furthermore, if desired, a fluorescent whitening agent, a antifoaming agent, a penetrating agent, or an antiseptic agent may also added to the preparing liquid (particularly the coating agent).

As the color developing agent layer in the invention, a layer, which is formed by preparing an aqueous dispersion liquid containing the metal salt of salicylic acid having a substituent, and at least one kind selected from the amide compound and the (meth)acrylic acid ester compound and by coating it on a substrate made of plastic, is particularly preferable, from the point of the aptitude for reading intra-surface pressure in a low pressure region and the intra-surface uniformity of pressure in a low pressure region.

When the preparing liquid for forming the color developing agent layer is used as a coating liquid, the method of coating the coating liquid may be practiced by the coating and drying using an ordinary coating machine. Specific examples of coating machines include a blade coater, a rod coater, an air knife coater, a curtain coater, a gravure coater, a bar coater, a roll coater, an extrusion coater, a die coater, a slide bead coater, a blade coater and the like.

When the material for pressure measurement of the invention is a 2-sheet type which is constituted by the coating or the like of the microcapsule including the colorless electron-donating dye precursor, and the electron-accepting compound on separated substrates, for example, by coating and drying directly or via another layer a coating liquid containing the color developing agent on an intended sheet-like substrate, a sheet material on which at least the color developing agent layer is formed may be obtained. And, when the material is a mono-sheet type which is constituted by the coating or the like of the microcapsule including the colorless electron-donating dye precursor, and the electron-accepting compound on a single sheet-like substrate, for example, by coating and drying directly or via another layer a coating liquid containing the color developing agent on an intended sheet-like substrate, the color developing agent layer constituting the material for pressure measurement may be formed.

EXAMPLES

Hereinafter, the present invention will be described more specifically according to Examples, but the invention is not limited to the following examples as long as the gist of the invention is not deviated. Unless otherwise noted, "parts" refer to parts by mass.

Example 1

Preparation of Microcapsule Liquid (A) Encapsulating Colorless Electron-Donating Dye Precursor In 70 parts of diarylethane, 18 parts of a compound (A) below was dissolved as the colorless electron-donating dye precursor to give a solution A. Next, 0.4 parts of a butylene oxide adduct of ethylene diamine dissolved in 1 part of methyl ethyl ketone was added to the solution A being stirred to give a solution B. Further, 2 parts of a trimethylolpropane adduct of tolylene diisocyanate dissolved in 1 part of methyl ethyl ketone was added to the solution B being stirred to give a solution C. Then, the solution C obtained as above was added to a solution prepared by dissolving 6 parts of polyvinyl alcohol in 150 parts of water to perform emulsification dispersion. Furthermore, to the emulsified liquid after the emulsification dispersion, 250 parts of water was added, which was heated to 80° C. with stirring, stirred for 1 hour and then cooled. Water was added to adjust the concentration to give the microcapsule liquid (A) of a microcapsules, which have a polyurethane-urea wall, encapsulating the colorless electron-donating dye precursor.

The number-average wall thickness (δ) of the obtained microcapsules was 0.11 μm, and the median diameter $D^{50}$ on a volume basis was 20 μm.

The number-average wall thickness was a mean value of capsule walls of 5 microcapsules determined with a scanning electron microscope, and the median diameter was calculated by applying the microcapsule liquid onto a desired support, then photographing it at a magnification of 150 times under a light microscope and measuring the size of every microcapsule in the range of 2 cm×2 cm area. δ/D was 0.006.

Compound (A)

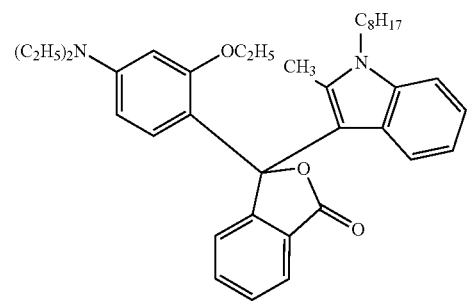

—Preparation of Colorless Electron-Donating Dye Sheet—

The microcapsule liquid (A) obtained as above was coated and dried on a polyethylene terephthalate (PET) sheet having a thickness of 75 µm with a curtain coating machine so as to give mass of 5.0 g/m² after drying, to form the color forming agent layer, and to give the colorless electron-donating dye sheet.

—Preparation of Color Developing Agent-Containing Liquid (A)—

100 parts of zinc 3,5-di(α-methylbenzyl)salicylate (a substituted metal salt of salicylic acid; the color developing agent) was mixed with 80 parts of toluene to be dissolved. The solution was mixed with 16 parts of a 25% aqueous solution of copolymer of acrylamide and butyl acrylate [an amide compound ((meth)acrylamide-based polymer); mole ratio 9:1], 0.2 parts of sodium carbonate, and 200 parts of water, which was dispersed with a homogenizer. After that, 60 parts of water was further added to it. The obtained dispersion liquid was heated to distill toluene, and, after that, the reaction machine was cooled to room temperature. A color developing agent dispersion liquid (A), in which the concentration of dispersed substance was 40% and the average particle diameter of the color developing agent was 0.95 µm, was prepared. After mixing and dispersing 24 parts of the color developing agent dispersion liquid (A), 100 parts of calcium carbonate, 6 parts of zinc oxide and 100 parts of water, 100 parts of a 10% aqueous solution of polyvinyl alcohol, 10 parts of styrene-butadiene latex in terms of solid content, and 450 parts of water were added to prepare the color developing agent-containing liquid (A).

—Preparation of Color Developing Agent Sheet—

On a polyethylene terephthalate (PET) sheet having a thickness of 75 µm, the obtained color developing agent-containing liquid (A) was coated and dried with a curtain coating machine so as to give a solid content coating amount of 6 g/m² to form the color developing agent layer, and thereby a color developing agent sheet was obtained.

In the way as described above, the material for pressure measurement of the invention of a 2-sheet type consisting of the colorless electron-donating dye sheet and the color developing agent sheet was produced.

—Evaluation and Measurement—

For the obtained microcapsule liquid (A) and the material for pressure measurement, following evaluation and measurement were carried out. Table 1 shows the result of the evaluation and measurement.

(1) Color Forming Density

The obtained material for pressure measurement was cut in a size of 5 cm×5 cm, and the colorless electron donating dye sheet and the color developing agent sheet were layered in such a way that the surface of the color forming agent layer of the colorless electron donating dye sheet and the surface of the color developing agent layer of the color developing agent sheet faced to each other. The layered sheets were pressurized with a pressure of 0.3 MPa to form color. After that, the layered sheets were separated, and the density ($D^A$) of the color forming portion formed on the color developing agent sheet were measured using a densitometer RD-19 (manufactured by GretagMacbeth). Further, separately from this, an initial density ($D^B$) was measured for an unused color developing agent sheet by the same method. Then, the color density $\Delta D$ was determined by subtracting the initial density $D^B$ from the density $D^A$, and evaluated under the following evaluation criteria. Meanwhile, "B" or more is in a practically allowable range.

—Evaluation Criteria—

A ($\Delta D > 0.7$): color forming was evidently recognized, and the density was high.
B ($0.5 \leq \Delta D \leq 0.7$): color forming was evidently recognized, and the density was rather high.
C ($0.3 \leq \Delta D < 0.5$): color forming was slightly recognized, but the density was low.
D ($\Delta D < 0.3$): color forming was slightly recognized.

(2) Reading Accuracy of Density

The obtained colorless electron donating dye sheet and the color developing agent sheet were cut in a size of 20 cm×20 cm, which were layered in such a way that the surface of the color forming agent layer of the colorless electron donating dye sheet and the surface of the color developing agent layer of the color developing agent sheet are disposed in contact with each other. The whole area of the layered sheets were pressurized at 0.15 MPa via a glass plate to make the whole surface form color. Then, the pressure distribution in the surface was analyzed with a pressure image analysis system (FPD-9210, manufactured by FUJIFILM CORPORATION), which was evaluated based on the following evaluation criteria.

—Evaluation Criteria—

A: no density unevenness existed, and the coloring was uniform.
B: density unevenness was slightly found, but was in a practically allowable range.
C: density unevenness was significant.

Example 2

The colorless electron donating dye sheet was produced in the substantially same manner as that in Example 1, except for changing the amount of the trimethylolpropane adduct of tolylenediisocyanate from 2 parts to 3 parts, and changing the δ/D of the microcapsule to 0.017 by intensifying the strength of the emulsification, in the preparation of the microcapsule liquid (A) encapsulating the colorless electron-donating dye precursor. Then, the same evaluation and measurement as those in Example 1 were carried out. Table 1 below shows the result of the evaluation and measurement.

Example 3

The color developing agent sheet was produced in the substantially same manner as that in Example 1, except for replacing zinc 3,5-di(α-methylbenzyl)salicylate used as the color developing agent by zinc 3-isododecyl salicylate (a substituted metal salt of salicylic acid). Then, the same evaluation and measurement as those in Example 1 were carried out. Table 1 below shows the result of the evaluation and measurement.

Example 4

The color developing agent sheet was produced in the substantially same manner as that in Example 1, except for replacing 16 parts of a 25% aqueous solution of an amide compound (copolymer of acrylamide and butyl acrylate (mole ratio 9:1)) by 16 parts of a 25% aqueous solution of copolymer of 2-ethylhexyl acrylate and acrylic acid [(meth) acrylic acid ester compound; mole ratio 1:4]. Then, the same evaluation and measurement as those in Example 1 were carried out. Table 1 below shows the result of the evaluation and measurement.

Example 5

The color developing agent sheet was prepared in the substantially same manner as that in Example 1, except for changing the color developing agent-containing liquid (A) to a color developing agent-containing liquid (C) below, which was coated and dried while setting the coating amount of the color developing agent to the same value. Then, the same evaluation and measurement as those in Example 1 were carried out. Table 1 below shows the result of the evaluation and measurement.

—Color Developing Agent-Containing Liquid (C)—

10 parts of zinc 3,5-di(α-methylbenzyl)salicylate (a substituted metal salt of salicylic acid; the color developing agent), 100 parts of calcium carbonate, 1 part of sodium hexametaphosphate, and 200 parts of water were dispersed so as to give an average particle diameter of 3 μm using a sand grinder to prepare a dispersion liquid. Then, to the dispersion liquid, 100 parts of a 10% aqueous solution of polyvinyl alcohol, 10 parts of styrene-butadiene latex in terms of solid content, and 450 parts of water were added to prepare the color developing agent-containing liquid (C: an amide compound and an (meth)acrylic acid ester compound were not added).

Comparative Example 1

An colorless electron donating dye sheet for comparison was produced in the substantially same manner as in Example 1, except for replacing the colorless electron-donating dye precursor-encapsulating microcapsule liquid (A) by an colorless electron-donating dye precursor-encapsulating microcapsule liquid (B) obtained by a method below. Then, the same evaluation and measurement as those in Example 1 were carried out. Table 1 below shows the result of the evaluation and measurement.

—Preparation of an Colorless Electron-Donating Dye Precursor-Encapsulating Microcapsule Liquid (B: a Microcapsule Having a Melamine Resin Wall)—

150 parts of a 3% aqueous solution of ethylene-maleic anhydride copolymer was prepared, which was mixed to a dissolving solution of 70 parts of diarylethane and 18 parts of the compound (A) being the colorless electron-donating dye precursor and subjected to emulsification dispersion, to give a emulsification dispersion liquid of the colorless electron-donating dye precursor. Next, 10 parts of melamine was added to 30 parts of formalin, which was heated to 60° C. to prepare a melamine-formaldehyde prepolymer liquid. The melamine-formaldehyde prepolymer liquid was added to the emulsification dispersion liquid of the colorless electron-donating dye precursor, which was reacted at 70° C. for 3 hours. It was cooled to room temperature to give the microcapsule liquid (B) of a microcapsule encapsulating the colorless electron-donating dye precursor and having a melamine resin wall.

The obtained microcapsule had a number-average wall thickness (δ) of 0.23 μm, and the median diameter $D^{50}$ on a volume basis was 15 μm. The number-average wall thickness and the median diameter were obtained in the same way as that in Example 1.

Comparative Example 2

An colorless electron donating dye sheet for comparison was produced in the substantially same manner as that in Example 1, except for changing δ/D of the microcapsule to 0.0006 by changing 2 parts of trimethylolpropane adduct of tolylenediisocyanate to 0.2 parts, in preparing the microcapsule liquid (A). Then, the same evaluation and measurement as those in Example 1 were carried out. Table 1 below shows the result of the evaluation and measurement.

Comparative Example 3

An colorless electron donating dye sheet for comparison was produced in the substantially same manner as in Example 1, except for changing 2 parts of trimethylolpropane adduct of tolylenediisocyanate to 4 parts and changing δ/D of the microcapsule to 0.024 by intensifying the strength of emulsification, in preparing the microcapsule liquid (A). Then, the same evaluation and measurement as those in Example 1 were carried out. Table 1 below shows the result of the evaluation and measurement.

Comparative Example 4

A color developing agent sheet for comparison was produced in the substantially same manner as in Example 1, except for changing zinc 3,5-di(α-methylbenzyl)salicylate used as the color developing agent by a phenol resin compound. Then, the same evaluation and measurement as those in Example 1 were carried out. Table 1 below shows the result of the evaluation and measurement.

TABLE 1

| | Capsule wall | Color developing agent containing liquid | δ/D | Wall thickness δ [μm] | Median diameter D [μm] | Color forming density | Reading accuracy of density |
|---|---|---|---|---|---|---|---|
| Example 1 | Urethane-urea | zinc 3,5-di(α-methylbenzyl) salicylate and amide compound | 0.006 | 0.11 | 20 | A | A |
| Example 2 | Urethane-urea | zinc 3,5-di(α-methylbenzyl) salicylate and amide compound | 0.017 | 0.25 | 15 | A | A |
| Example 3 | Urethane-urea | zinc 3-isododecyl salicylate and amide compound | 0.006 | 0.11 | 20 | A | A |
| Example 4 | Urethane-urea | zinc 3,5-di(α-methylbenzyl) salicylate and (meth)acrylic acid ester compound | 0.006 | 0.11 | 20 | A | A |
| Example 5 | Urethane-urea | zinc 3,5-di(α-methylbenzyl) salicylate | 0.006 | 0.11 | 20 | B | A |
| Comparative Example 1 | Melamine-formaldehyde | zinc 3,5-di(α-methylbenzyl) salicylate and amide compound | 0.015 | 0.23 | 15 | C | C |
| Comparative Example 2 | Urethane-urea | zinc 3,5-di(α-methylbenzyl) salicylate and amide compound | 0.0006 | 0.011 | 20 | Color was formed only by layering with a color developing agent sheet. Dye precursor leaked from a capsule. | Evaluation impossible |

TABLE 1-continued

|  | Capsule wall | Color developing agent containing liquid | δ/D | Wall thickness δ [μm] | Median diameter D [μm] | Color forming density | Reading accuracy of density |
|---|---|---|---|---|---|---|---|
| Comparative Example 3 | Urethane-urea | zinc 3,5-di(α-methylbenzyl) salicylate and amide compound | 0.024 | 0.36 | 15 | C | B |
| Comparative Example 4 | Urethane-urea | phenol resin compound | 0.006 | 0.11 | 20 | C | C |

As shown in Table 1 above, in Examples, excellent color forming (coloring) density was obtained even when surface pressure was given and pressure was applied at such a low pressure as 3 MPa or less. In addition, density reading properties in the color forming portion and the accuracy of repeated reading thereof were excellent to give the performance that can be applied to fields for finding the pressure state by giving local pressure or surface pressure of a low pressure (preferably 3 MPa or less). In contrast, in Comparative Examples, a little color was formed because the given pressure was too low, to result in worse density reading properties and low accuracy upon repeated reading.

The entire disclosure of Japanese Patent Application No. 2007-179969 is incorporated herein into this specification by reference.

All documents, patent applications and technical specifications recited in this specification are incorporated herein by reference in this specification to the same extent as if each individual publication, patent applications and technical standard was specifically and individually indicated to be incorporated by reference.

The invention claimed is:

1. A material for pressure measurement comprising a substrate made of plastic, a color forming agent layer containing a colorless electron-donating dye precursor and a color developing agent layer containing an electron-accepting compound, the material for pressure measurement forming a color utilizing a color forming reaction between the colorless electron-donating dye precursor and the electron-accepting compound,
   wherein the colorless electron-donating dye precursor is included in a microcapsule containing an urethane bond, wherein at least one kind of the electron-accepting compounds is a metal salt of salicylic acid having a substituent, and wherein the microcapsule satisfies the relation $\delta/D$=from $1.0\times10^{-3}$ to $2.0\times10^{-2}$, where $\delta$ is the number-average wall thickness (μm) of the microcapsules, and D is the median diameter (μm) of the microcapsules on a volume basis.

2. The material for pressure measurement according to claim 1, wherein the material for pressure measurement forms a color at a pressure of 3 MPa or less.

3. The material for pressure measurement according to claim 1, wherein the median diameter of the microcapsules on a volume basis is 10 μm or more.

4. The material for pressure measurement according to claim 1, wherein the color developing agent layer further contains at least one compound selected from amide compounds and (meth)acrylic acid ester compounds.

5. The material for pressure measurement according to claim 4, wherein the amide compound is a (meth)acrylamide-based polymer or a sulfonamide compound, and the (meth)acrylic acid ester compound is a (meth)acrylic acid ester-based polymer.

6. The material for pressure measurement according to claim 4, wherein the total content of the amide compound and the (meth)acrylic acid ester compound in the color developing agent layer is from 0.2 to 20 parts by mass relative to 100 parts by mass of the electron-accepting compound.

7. The material for pressure measurement according to claim 1, wherein the color developing agent layer is formed by coating an aqueous dispersion liquid containing a metal salt of salicylic acid having a substituent and at least one compound selected from amide compounds and (meth)acrylic acid ester compounds on the substrate.

8. The material for pressure measurement according to claim 1, wherein the color developing agent layer containing the electron-accepting compound and the color forming agent layer containing the microcapsule including the colorless electron-donating dye precursor are disposed in this order on a substrate.

9. The material for pressure measurement according to claim 1 comprising a material A having the color developing agent layer containing an electron-accepting compound on a substrate, and a material B having the color forming agent layer containing a microcapsules including an colorless electron-donating dye precursor on a substrate.

10. The material for pressure measurement according to claim 1, wherein the molar absorbance coefficient ($\epsilon$) of the colorless electron-donating dye precursor is 10,000 mol$^{-1}$·cm$^{-1}$·L or more.

11. The material for pressure measurement according to claim 10, wherein the ratio of the colorless electron-donating dye precursor having a molar absorbance coefficient ($\epsilon$) of 10,000 mol$^{-1}$·cm$^{-1}$·L or more, with respect to a total amount of the colorless electron-donating dye precursor, is from 30 to 100% by mass.

12. The material for pressure measurement according to claim 1, wherein the capsule wall thickness of the microcapsules is in the range of 0.005 to 2.0 μm.

13. The material for pressure measurement according to claim 1, wherein the median diameter of the microcapsules on a volume basis is from 10 to 40 μm, and the capsule wall thickness of the microcapsules is from 0.01 to 1 μm.

14. The material for pressure measurement according to claim 1, wherein the substituent of a metal salt of salicylic acid is an alkyl group having 1 to 15 carbon atoms or an aralkyl group having 7 to 18 carbon atoms.

15. The material for pressure measurement according to claim 1, wherein the metal salt of salicylic acid is a zinc salt, a nickel salt, an aluminum salt or a calcium salt of salicylic acid.

16. The material for pressure measurement according to claim 1, wherein the capsule wall of the microcapsule is made of polyurethane-urea.

17. The material for pressure measurement according to claim 1, wherein the $\delta/D$ is from $2.0\times10^{-3}$ to $1.5\times10^{-2}$.

18. The material for pressure measurement according to claim 1, wherein an amount of the metal salt of salicylic acid in the color developing agent layer is from 0.1 to 30 g/m$^2$.

* * * * *